United States Patent [19]
Larsen

[11] Patent Number: 5,969,934
[45] Date of Patent: Oct. 19, 1999

[54] ELECTROSTATIC WAFER CLAMP HAVING LOW PARTICULATE CONTAMINATION OF WAFERS

[75] Inventor: Grant Kenji Larsen, Gloucester, Mass.

[73] Assignee: Varian Semiconductor Equipment Associats, Inc., Gloucester, Mass.

[21] Appl. No.: 09/058,944

[22] Filed: Apr. 10, 1998

[51] Int. Cl.[6] .................................................. H02N 13/00
[52] U.S. Cl. .......................................... 361/234; 279/128
[58] Field of Search .................................. 361/233, 234; 279/128

[56] References Cited

U.S. PATENT DOCUMENTS

| | | | |
|---|---|---|---|
| 3,993,509 | 11/1976 | McGinty | 148/1.5 |
| 4,184,188 | 1/1980 | Briglia | 361/234 |
| 4,384,918 | 5/1983 | Abe | 156/643 |
| 4,412,133 | 10/1983 | Eckes et al. | 250/492.2 |
| 4,457,359 | 7/1984 | Holden | 165/80 |
| 4,480,284 | 10/1984 | Tojo et al. | 361/234 |
| 4,502,094 | 2/1985 | Lewin et al. | 361/234 |
| 4,520,421 | 5/1985 | Sakitani et al. | 361/234 |
| 4,554,611 | 11/1985 | Lewin | 361/234 |
| 4,603,466 | 8/1986 | Morley | 29/569 R |
| 4,645,218 | 2/1987 | Ooshio et al. | 361/234 |
| 4,665,463 | 5/1987 | Ward et al. | 361/234 |
| 4,692,836 | 9/1987 | Suzuki | 361/234 |
| 4,724,510 | 2/1988 | Wicker et al. | 361/234 |
| 4,832,781 | 5/1989 | Mears | 156/345 |
| 4,938,992 | 7/1990 | Mears | 427/38 |
| 5,103,367 | 4/1992 | Horwitz et al. | 361/234 |
| 5,166,856 | 11/1992 | Liporace et al. | 361/233 |
| 5,179,498 | 1/1993 | Hongoh et al. | 361/234 |
| 5,275,683 | 1/1994 | Arami et al. | 156/345 |
| 5,315,473 | 5/1994 | Collins et al. | 361/234 |
| 5,345,999 | 9/1994 | Hosokawa | 165/80.2 |
| 5,384,682 | 1/1995 | Watanabe et al. | 361/234 |
| 5,436,790 | 7/1995 | Blake et al. | 361/234 |
| 5,444,597 | 8/1995 | Blake et al. | 361/234 |
| 5,452,177 | 9/1995 | Frutiger | 361/234 |
| 5,460,684 | 10/1995 | Saeki et al. | 156/345 |
| 5,474,614 | 12/1995 | Robbins | 118/728 |
| 5,528,451 | 6/1996 | Su | 361/234 |
| 5,535,090 | 7/1996 | Sherman | 361/234 |
| 5,560,780 | 10/1996 | Wu et al. | 361/234 |
| 5,583,726 | 12/1996 | Anderson et al. | 361/234 |
| 5,606,485 | 2/1997 | Shamouilian et al. | 361/234 |
| 5,612,850 | 3/1997 | Birang et al. | 361/234 |
| 5,631,803 | 5/1997 | Cameron et al. | 361/234 |
| 5,634,266 | 6/1997 | Sherstinsky et al. | 29/825 |
| 5,636,098 | 6/1997 | Salfelder et al. | 361/234 |
| 5,644,467 | 7/1997 | Steger et al. | 361/234 |
| 5,646,814 | 7/1997 | Shamouilian et al. | 361/234 |
| 5,754,391 | 5/1998 | Bates | 361/234 |
| 5,812,362 | 9/1998 | Ravi | 361/234 |

FOREIGN PATENT DOCUMENTS

| | | |
|---|---|---|
| 0783 175 A2 | 7/1996 | European Pat. Off. . |
| 0780 885 A2 | 6/1997 | European Pat. Off. . |
| 4-132239 | 5/1992 | Japan . |
| 4-371579 | 12/1992 | Japan . |

OTHER PUBLICATIONS

Wardly, George A., "Electrostatic Wafer Chuck for Electron Beam Microfabrication", Rev. Sci. Instrum., vol. 44, No. 10, Oct. 1973, pp. 15–6–1509.

*Primary Examiner*—Fritz Fleming
*Attorney, Agent, or Firm*—Wolf, Greenfield & Sacks, P.c.

[57] ABSTRACT

Apparatus for electrostatic clamping of a workpiece, such as a semiconductor wafer, includes a platen assembly defining an electrically-insulating clamping surface for receiving the workpiece. The platen assembly includes electrodes underlying and electrically isolated from the clamping surface and a dielectric layer between the electrodes and the clamping surface. The dielectric layer may have a periphery which is beveled to define a blunt first edge that forms a boundary of the clamping surface and a second edge that is spaced from the workpiece. A thin, low friction, high hardness dielectric coating may be provided over the dielectric layer. The electrodes may be fabricated of niobium. The disclosed electrostatic wafer clamp provides excellent performance with respect to particulate contamination of the workpiece.

33 Claims, 3 Drawing Sheets

ELECTROSTATIC WAFER CLAMP HAVING LOW PARTICULATE CONTAMINATION OF WAFERS

FIELD OF THE INVENTION

This invention relates to apparatus for electrostatic clamping of semiconductor wafers in a vacuum processing chamber and, more particularly, to electrostatic clamping apparatus which provides excellent performance with respect to particulate contamination of wafers. The apparatus is particularly useful in ion implantation systems, but is not limited to such use.

BACKGROUND OF THE INVENTION

In the fabrication of integrated circuits, a number of well-established processes involve the application of ion beams to semiconductor wafers in vacuum. These processes include, for example, ion implantation, ion beam milling and reactive ion etching. In each instance, a beam of ions is generated in a source and is directed with varying degrees of acceleration toward a target wafer. Ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded in the crystalline lattice of the semiconductor material to form a region of desired conductivity.

The target mounting site is a critical part of an ion implantation system. The target mounting site is required to firmly clamp a semiconductor wafer in a fixed position for ion implantation and, in most cases, to provide cooling of the wafer. In addition, means must be provided for exchanging wafers after completion of ion implantation. Cooling of wafers is particularly important in commercial semiconductor processing wherein a major objective is to achieve a high throughput in terms of wafers processed per unit time. One way to achieve high throughput is to use a high current ion beam so that the implantation process is completed in a shorter time. However, large amounts of heat are likely to be generated by the high current ion beam. The heat can result in uncontrolled diffusion of impurities beyond prescribed limits in the wafer and in degradation of patterned photoresist layers. It is usually necessary to provide wafer cooling in order to limit the maximum wafer temperature to about 100° C.

A number of techniques for clamping a semiconductor wafer at the target mounting site are known in the art. One known technique involves the use of electrostatic forces. A dielectric layer is positioned between a semiconductor wafer and a conductive support plate. A voltage is applied between the semiconductor wafer and the support plate, and the wafer is clamped against the dielectric layer by electrostatic forces. An electrostatic wafer clamp is disclosed by G. A. Wardly in "Electrostatic Wafer Chuck for Electron Beam Microfabrication", *Rev. Sci. Instrum.*, Vol. 44, No. 10, Oct. 1972, pp. 1506–1509 and in U.S. Pat. No. 3,993,509 issued Nov. 23, 1976 to McGinty. Electrostatic wafer clamp arrangements which utilize a thermally-conductive material to remove heat from the wafer are disclosed in U.S. Pat. No. 4,502,094, issued Feb. 26, 1985 to Lewin et al., U.S. Pat. No. 4,665,463, issued May 12, 1987 to Ward et al., and U.S. Pat. No. 4,184,188, issued Jan. 15, 1980 to Briglia. The Briglia patent discloses a support plate having layers of thermally-conductive, electrically-insulative RTV silicone. Electrostatic wafer clamps are also disclosed in U.S. Pat. No. 4,480,284, issued Oct. 30, 1984 to Tojo et al., U.S. Pat. No. 4,554,611, issued Nov. 19, 1985 to Lewin, U.S. Pat. No. 4,724,510, issued Feb. 9, 1988 to Wicker et al. and U.S. Pat. No. 4,412,133, issued Oct. 25, 1983 to Eckes et al.

U.S. Pat. No. 4,520,421, issued May 28, 1985 to Sakitani et al., discloses a specimen supporting device including a pair of specimen attracting portions each having an electrode on the lower surface of an insulating member. When a voltage is applied between the pair of specimen attracting portions, the specimen is electrostatically attracted to the upper surface. The voltage can be AC or DC. An embodiment having eight arcuate specimen attracting portions with voltages of alternately opposite polarities is disclosed.

U.S. Pat. No. 5,103,367, issued Apr. 7, 1972 to Horowitz et al., discloses an electrostatic chuck for semiconductor wafers having at least three electrodes. Two of the electrodes embedded in a dielectric film are energized by an AC supply to provide sine wave fields of controlled amplitude and phase. The relative phases and amplitudes of the electrode voltages are adjusted to null the voltage induced on the surface of the wafer. In one embodiment, the substrate support surface comprises a thin ceramic layer such as sapphire ($Al_2O_3$).

U.S. Pat. No. 5,166,856, issued Nov. 24, 1992 to Liporace et al., discloses an electrostatic chuck including a body of refractory metal sized to support a semiconductor wafer. A first layer of diamond coats the refractory metal body. A pair of generally planar electrodes is disposed on the first layer of diamond. A second layer of diamond conformally coats the electrodes. A DC voltage applied between the electrodes develops an electrostatic force to hold the wafer against the second diamond layer.

Problems associated with prior art electrostatic wafer clamping arrangements include inadequate clamping force, damage to devices on the wafer by charging currents, difficulty in making electrical contact to the semiconductor wafer, and wafer sticking to the platen after the clamping voltage has been removed. In addition, thermal transfer characteristics have usually been inadequate for high current ion implantation applications, since a significant portion of the platen surface area is devoted to making electrical contact with the semiconductor wafer. See, for example, the aforementioned U.S. Pat. No. 4,502,094.

An electrostatic wafer clamp that provides highly satisfactory performance is disclosed in U.S. Pat. No. 4,452,177, issued Sep. 19, 1995 to Frutiger. A six-phase electrostatic wafer clamp includes a platen having six symmetrically located electrodes. Voltages with six different phases are applied to the electrodes, with the voltages applied to electrodes on opposite sides of the platen being one-half cycle out of phase. The applied voltages are preferably bipolar square waves.

As semiconductor device geometries become progressively smaller and wafer sizes become progressively larger, the allowable particulate contamination specifications become more restrictive. The particulate performance of electrostatic wafer clamps is of particular concern because the wafers physically contact the surface of the wafer clamp and because the electrostatic forces which are employed to clamp wafers also attract particles. Accordingly, it is desirable to provide electrostatic wafer clamp configurations wherein particle generation and particulate contamination of wafers are extremely low.

SUMMARY OF THE INVENTION

According to a first aspect of the invention, apparatus for electrostatic clamping of a workpiece is provided. The apparatus comprises a platen assembly defining an electrically insulating clamping surface for receiving a workpiece. The platen assembly comprises electrodes underlying and electrically isolated from the clamping surface and a dielectric layer between the electrodes and the clamping surface. The dielectric layer has a periphery which is beveled to define a blunt first edge that forms a boundary of the clamping surface and a second edge that is spaced from the workpiece. The apparatus further comprises clamping control means for applying clamping voltages to the electrodes for electrostatically clamping the workpiece in a fixed position on the clamping surface.

Preferably, the beveled periphery of the dielectric layer defines a beveled surface that forms an angle of less than about 10 degrees with respect to the workpiece positioned on the clamping surface. The beveled surface is preferably located outwardly of the electrodes. The blunt edge which forms the boundary of the clamping surface is unlikely to generate particles by abrasion of the workpiece and is unlikely to electrostatically attract particles. Since the second edge is spaced from the workpiece, abrasion of the workpiece is unlikely and particles attracted to the second edge by electrostatic attraction do not contact the workpiece.

According to another aspect of the invention apparatus for electrostatic clamping of a workpiece is provided. The apparatus comprises a platen assembly defining an electrically insulating clamping surface for receiving a workpiece. The platen assembly comprises electrodes underlying and electrically isolated from the clamping surface, a relatively thick dielectric layer between the electrodes and the clamping surface and a relatively thin, low friction, high hardness dielectric coating overlying the dielectric layer and forming the clamping surface. The clamping apparatus further comprises clamping control means for applying clamping control voltages to the electrodes for electrostatically clamping the workpiece in a fixed position on the clamping surface.

The dielectric coating may comprise a diamond-like amorphous carbon coating. The dielectric coating preferably has a thickness in the range of about 0.5 micrometer to about 5.0 micrometers and more preferably has a thickness of about 1.5 micrometers. Preferably, the coating covers the side of the dielectric layer adjacent to the clamping surface. In a preferred embodiment, the dielectric layer comprises alumina and the electrodes comprise niobium.

In a preferred construction, the platen comprises a plurality of sector assemblies mounted on a platen base. The sector assemblies define a substantially circular, electrically-insulating clamping surface for receiving a semiconductor wafer. Each of the sector assemblies comprises a conductive electrode underlying and electrically isolated from the clamping surface, an upper dielectric layer between the electrode and the clamping surface, and a lower dielectric layer between the electrode and the platen base. The platen may incorporate one or more of the novel features described above.

BRIEF DESCRIPTION OF THE DRAWINGS

For a better understanding of the present invention, reference is made to the accompanying drawings, which are incorporated herein by reference and in which.

DETAILED DESCRIPTION OF THE DRAWINGS

Figure 1:
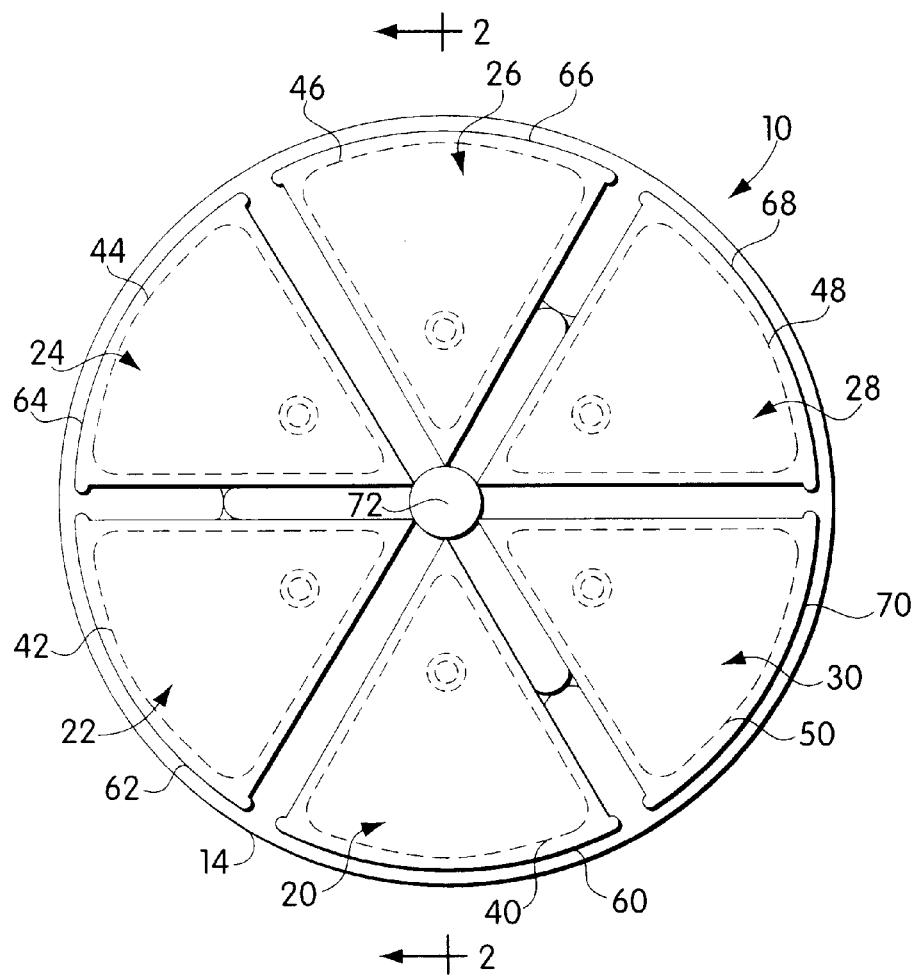
FIG. 1 is a schematic plan view of an example of electrostatic wafer clamping apparatus suitable for incorporation of the present invention.

An example of apparatus for electrostatic clamping of a workpiece, such as a semiconductor wafer, is shown in simplified form in FIGS. 1–4. An electrostatic wafer clamping apparatus includes a platen 10 and a clamping control circuit 12 for applying clamping voltages to the platen 10 when clamping of a workpiece is desired. The platen 10 includes a support plate, or a platen base 14, and six sector assemblies 20, 22, 24, 26, 28 and 30 mounted on an upper surface of platen base 14. The platen base 14 is generally circular and may have a central opening 18 for a wafer lift mechanism (not shown).

Figure 2:
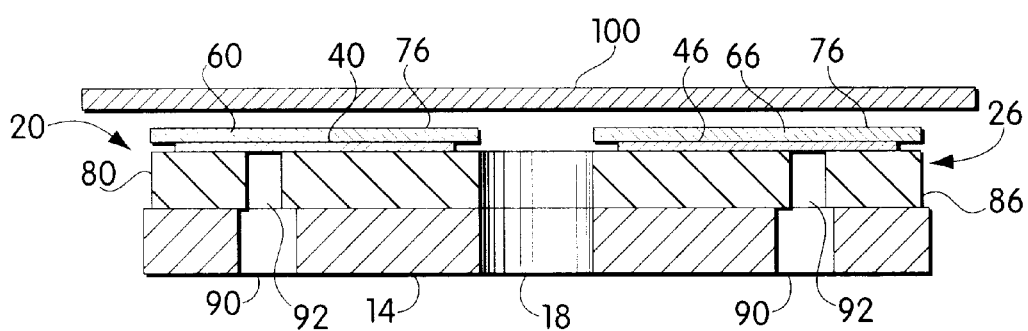
FIG. 2 is a schematic cross-sectional view of the wafer clamping apparatus, taken along the line 2—2 of FIG. 1.

Each of the sector assemblies includes a sector electrode located between an upper sector insulator and a lower sector insulator. Sector assemblies 20, 22, 24, 26, 28 and 30 include sector electrodes 40, 42, 44, 46, 48 and 50, respectively. Upper sector insulators 60, 62, 64, 66, 68 and 70 cover electrodes 40, 42, 44, 46, 48 and 50, respectively. The electrodes are preferably thin metal layers formed on the lower surfaces of the respective upper sector insulators. The electrodes 40, 42, 44, 46, 48 and 50 preferably have equal areas and are symmetrically disposed with respect to a center 72 of platen 10. The electrodes are electrically isolated from each other and, in a preferred embodiment, are sector-shaped as shown in FIG. 1. The upper surfaces of sector insulators 60, 62, 64, 66, 68 and 70 are coplanar. As discussed below, the upper section insulators preferably have a thin coating which defines a wafer clamping surface 76. When the coating is not utilized, the upper surfaces of the upper sector insulators define the wafer clamping surface. As shown in FIG. 2, sector assembly 20 includes a lower sector insulator 80 and sector assembly 26 includes a lower sector insulator 86. The remaining sector assemblies have the same construction. Preferably, the upper and lower sector insulators of each sector assembly overlap the edges of the respective electrodes to prevent contact between the electrodes and the wafer.

In the embodiment of FIGS. 1–4, a separate sector assembly including sector-shaped upper and lower sector insulators, is fabricated for each electrode. In other embodiments, the upper insulator or the lower insulator, or both, may be formed as a circular disk. Multiple electrodes may be formed on the lower surface of the circular upper insulator. This configuration may be practical for relatively small platens.

The platen base 14 and the lower sector insulators 80, 86, etc., are provided with aligned openings 90 and 92, respectively, underlying each of the electrodes. The openings 90 and 92 permit electrical connection to each of the electrodes. A semiconductor wafer 100 is shown in FIG. 2 positioned above clamping surface 76. When clamping voltages are applied to electrodes 40, 42, 44, 46, 48 and 50, the wafer 100 is electrostatically clamped in a fixed position against clamping surface 76.

The upper sector insulators 60, 62, 64, 66, 68 and 70 are preferably a hard ceramic material that has high dielectric strength and high permittivity, and does not exhibit bulk polarization at the frequency and voltage used for clamping. Preferred materials include alumina, sapphire, silicon carbide and aluminum nitride. The upper sector insulators may, for example, have a thickness of about 0.008 inch to permit reliable clamping with a voltage having a peak amplitude of about 1,000 volts. The upper surfaces of the upper sector insulators are ground flat to within 0.001 inch.

The electrodes 40, 42, 44, 46, 48 and 50 are preferably formed by depositing metal layers on the lower surfaces of the respective upper sector insulators 60, 62, 64, 66, 68 and 70. In a preferred embodiment, the electrodes comprise a conductive coating of niobium. The thickness of each electrode is typically on the order of about one micrometer. Other suitable conductive metal layers may be used within the scope of the invention. For example, titanium-molybdenum electrodes are described in the aforementioned U.S. Pat. No. 5,452,177.

The lower sector insulators have sufficient thickness to provide structural rigidity and to electrically isolate the electrodes. The lower sector insulators are preferably fabricated of the same or a similar material as the upper sector insulators for matching of thermal expansion coefficients. In a preferred embodiment, the lower sector insulators are fabricated of alumina. The platen base 14 is typically fabricated of a metal such as aluminum.

Each upper sector insulator having an electrode formed on its lower surface is bonded to the upper surface of the lower sector insulator, preferably using a thermoplastic tetrafluoroethylene adhesive 108 (FIG. 4), such as Teflon FEP bonding material.

The clamping voltages applied to the electrodes of platen 10 are preferably bipolar square waves having six different phases (0°, 60°, 120°, 180°, 240° and 300°). The phases of the voltages applied to electrodes on opposite sides of platen 10 are one-half cycle, or 180°, out of phase. Thus, the voltages applied to electrodes 40 and 46 are one-half cycle out of phase; the voltages applied to electrodes 42 and 48 are one-half cycle out of phase; and the voltages applied to electrodes 44 and 50 are one-half cycle out of phase. The disclosed clamping apparatus provides reliable clamping and unclamping of wafers without requiring electrical contact to the wafer and without producing charging currents which could potentially damage the wafer.

Figure 3:
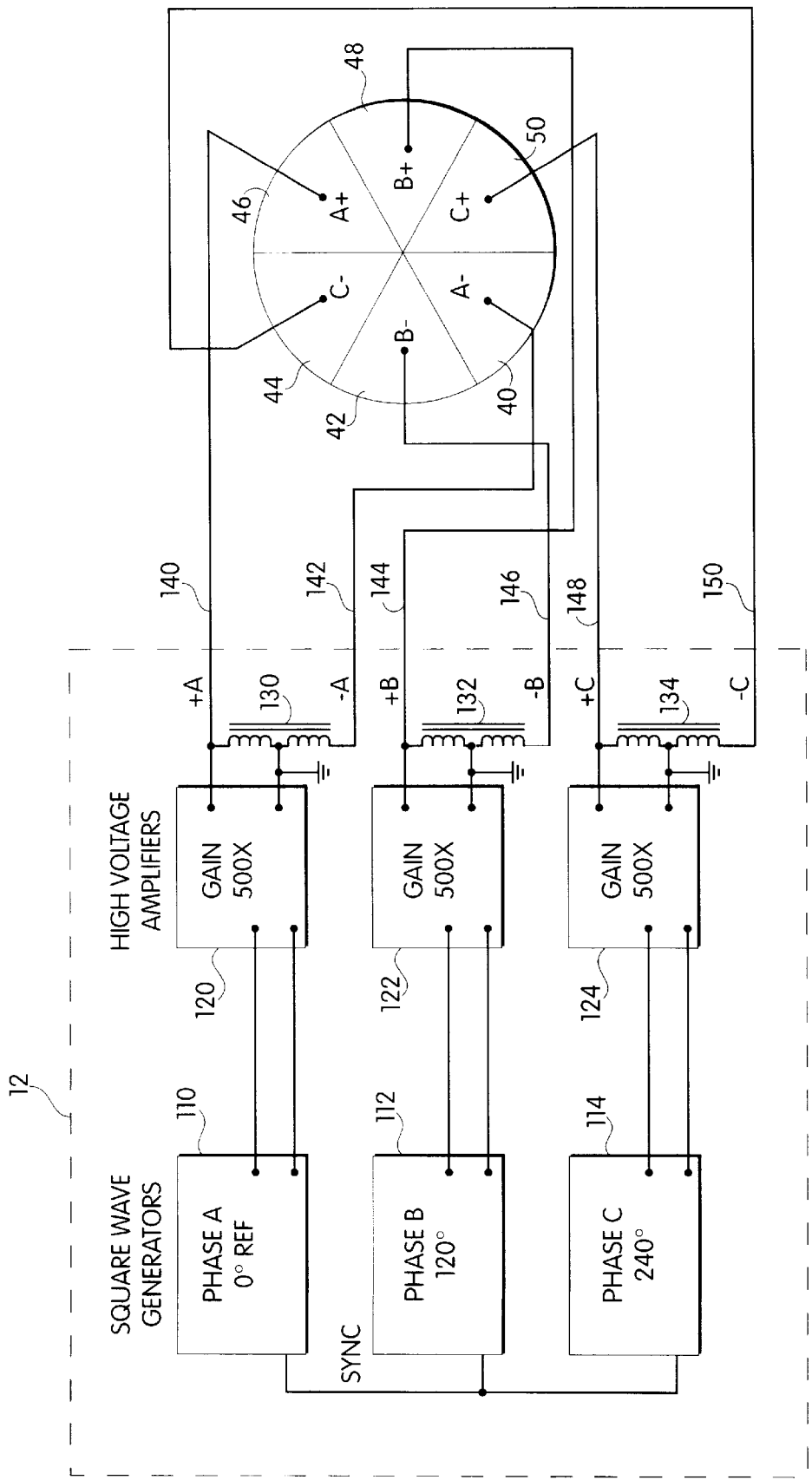
FIG. 3 is a schematic block diagram of the electrostatic wafer clamping apparatus, showing an example of a clamping control circuit.

An example of a suitable clamping control circuit 12 is shown in FIG. 3. Square wave generators 110, 112 and 114 supply low voltage square waves to amplifiers 120, 122 and 124, respectively. The outputs of amplifiers 120, 122 and 124 are applied to high voltage inverter transformers 130, 132 and 134, respectively. The transformers 130, 132 and 134 produce output voltages that are 180°, or one-half cycle, out of phase. The outputs of transformer 130 on lines 140 and 142 are bipolar square waves that are one-half cycle out of phase. The outputs on lines 140 and 142 are connected to electrodes 46 and 40, respectively. The outputs of transformer 130 on lines 144 and 146 are bipolar square waves that are one-half cycle out of phase and are shifted by 120° relative to the outputs of transformer 130. The outputs of transformer 132 on lines 144 and 146 are connected to electrodes 48 and 42, respectively. The outputs of transformer 134 on lines 148 and 150 are one-half cycle out of phase and are shifted by 240° relative to the outputs of transformer 130. The outputs of transformer 134 on lines 148 and 150 are connected to electrodes 50 and 44, respectively. This configuration provides six phase clamping of the wafer. Additional details regarding the clamping control circuit and the clamping voltages are provided in the aforementioned U.S. Pat. No. 4,452,177, which is hereby incorporated by reference.

Figure 4:
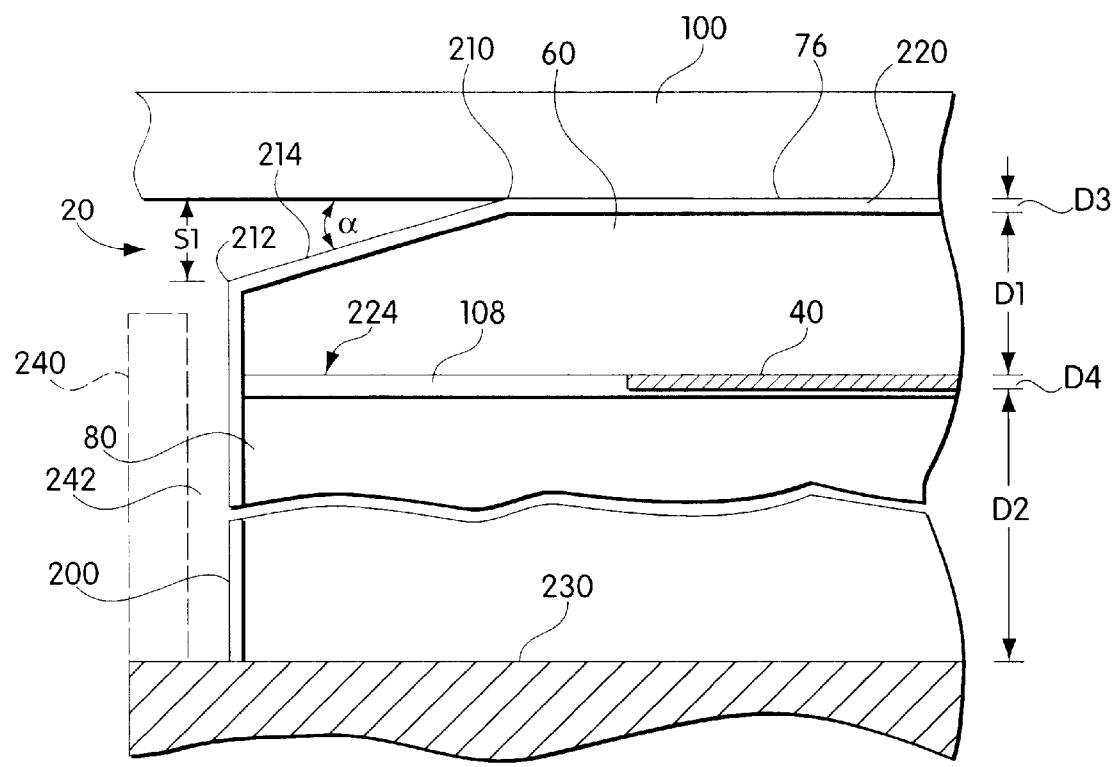
FIG. 4 is a partial cross-sectional view of an example of an implementation of the electrostatic wafer clamping apparatus of the invention.

A partial cross-sectional view of an example of an implementation of the electrostatic wafer clamp of the invention is shown in FIG. 4. Like elements in FIGS. 1, 2 and 4 have the same reference numerals. A portion of sector assembly 20 is shown. It will be understood that FIG. 4 is not drawn to scale in order to facilitate an understanding of the present invention. As indicated, electrode 40 is positioned between upper sector insulator 60 and lower sector insulator 80. Sector insulators 60 and 80 are secured together with adhesive 108. Electrode 40 is preferably spaced from a side 200 of sector assembly 20. In a preferred embodiment, electrode 40 is spaced from side 200 by about 0.1 inch.

In accordance with a first aspect of the invention, a periphery of upper sector insulator 60 is beveled to define a first blunt edge 210 that forms a boundary of clamping surface 76, and a second edge 212 that is spaced from the wafer 100. The beveled periphery defines a beveled surface 214 that forms a relatively shallow angle $\alpha$ with respect to the wafer 100 positioned on clamping surface 76. Preferably, the periphery of each of the upper sector insulators 60, 62, 64, 66, 68 and 70 (FIG. 1) is beveled in this manner. The blunt edge 210 that forms the intersection between beveled surface 214 and clamping surface 76 is preferably blended and polished to form a smooth transition between these surfaces. The angle $\alpha$ is preferably less than about 10°, so that the beveled surface 214 has a very small slope relative to clamping surface 76. Although edge 212 may be relatively sharp, it is spaced from wafer by a spacing S1 preferably by at least about 0.004 inch and does not normally contact wafer 100.

The effect of the beveled periphery is a tapering of the clamping surface toward the edges of the sector assembly, with no sharp edge contacting wafer 100. When the wafer contacts blunt edge 210, it contacts a relatively large surface so that forces are distributed. This reduces the amount of damage sustained by the wafer and thereby reduces the number of particles generated. Furthermore, the beveled surface 214 is relatively wide compared to the particle size. When the clamp is energized, free particles in the vacuum chamber are attracted to the platen edge by the electrostatic field. These particles tend to collect on the beveled surface 214 and in the vicinity of edge 212. The quantity of particles is determined by the quantity of free particles in the system. In prior art electrostatic wafer clamps wherein clamping surface has a sharp edge in contact with the wafer, the particle density at the sharp edge can be quite high. Particles located at the boundary of the clamping surface act as a grinding powder which damages the wafer and creates additional particles. By providing relatively wide beveled surface 214 in accordance with the invention, the density of the deposited particles is low, thereby reducing the risk of damage and further particle generation.

The edges 210 and 212 are preferably rounded and polished to remove protruding grains of the dielectric material, typically alumina, which can be quite sharp and cause wafer damage. Such sharp protruding grains may not only damage the wafer, but also act as fulcrums on which the wafer pivots. The wafer rests on such protruding grains, allowing free space between the clamping surface and the wafer. This effectively adds another dielectric layer to the clamp and increases the distance between the electrode and the wafer, both of which reduce the clamping force. Due to variations in surface features and flatness of the wafers, no two wafers rest on the protruding grains in exactly the same manner. Consequently, the clamping force and the number of particles generated per wafer are likely to vary. The removal of these sharp protruding grains has been shown to produce a nine-fold decrease in clamping force variation and an over fifty-fold decrease in particle count variation.

In a preferred embodiment, the upper sector insulator 60 is high purity (99.5%) alumina having a thickness D1 of about 0.008 inch. Lower sector insulator 80 may be lower purity alumina having a thickness D2 of about 0.1 inch. Beveled surface 214 has a width of about 0.035 inch, and the angle a with respect to wafer 100 is about 5°. As a result, edge 212 is spaced from wafer 100 by spacing S1 on the order of about 0.004 inch, and particles that accumulate at edge 212 are unlikely to contact wafer 100. Beveled surface 214 is preferably located outwardly of electrode 40 toward the side 200 of sector assembly 20. It will be understood that the above dimensions are given by way of example only and are in no way limiting as to the scope of the present invention.

According to a further aspect of the invention, a low friction, high hardness dielectric coating 220 is applied to the upper surface of each of the upper sector insulators 60, 62, 64, 66, 68 and 70. In a preferred embodiment, the coating 220 is a diamond-like, amorphous carbon coating. Other suitable coating materials include silicon carbide and aluminum nitride. The coating preferably has a thickness D3 in a range of about 0.5 micrometer to about 5.0 micrometers, and more preferably has a thickness of about 1.5 micrometers. The coating 220 thereby defines the clamping surface 76 of the wafer clamp. In addition to covering the upper surface of each of the upper insulators, the coating 220 preferably covers beveled surface 214 and side 200 of each of the sector assemblies. The carbon coating may be applied by conformal plasma induced vapor deposition, using known techniques.

The coating provides a number of advantages. It lowers friction between the clamping surface 76 of the platen and wafer 100. Thus, if the wafer moves laterally relative to the clamping surface, features on the wafer tend to slide rather than break off and become particles. The coating provides a relatively hermetic seal over the grain structure of upper sector insulator 60 which, as noted above, is typically alumina. This means that particles are not ground into the grain structure, to be retained and later released. The brown staining that has been observed in the absence of the coating is not observed when the coating is utilized.

The thickness of the coating increases the radius of sharp surface features on the platen by the thickness of the coating. Where the coating has a thickness of 1.5 micrometers, the radii of surface features are increased by an order of magnitude relative to the diameter of the smallest and most numerous particles of concern in semiconductor wafer processing. The increase in radius of surface features produces an effectively higher negative rake angle between such features and the wafer, thus requiring more energy to break off a feature and create a particle. The wafer tends to slip up and slide over such features rather than being gouged.

Additionally, the coating provides a relatively hermetic seal of the sides of the sector assembly. In particular, the coating 220 covers side 200 of sector assembly 20 and seals interface 224 between upper sector insulator 60 and lower sector insulator 80. As indicated, the upper and lower sector insulators are fastened together with adhesive 108. The coating 220 prevents water vapor in the atmosphere, which may be present during storage and assembly, from entering the sides of the sector assembly. Water vapor entering the sector assembly along interface 224 may have the following undesirable effects: (1) the electrode 40 may corrode at its edge; (2) the Teflon adhesive layer may expand; (3) the edges of the sector assembly may deflect upwardly in the direction of wafer 100, potentially causing damage to wafers, due to the expansion at the edges caused by corrosion and water vapor absorption; and (4) sufficient water vapor may be retained such that a path from the electrode to ground is formed. In this case, the water boils instantly and the insulator cracks and is literally blown off the top of the sector assembly.

According to a further feature of the invention, electrode 40 preferably comprises niobium. Wetting of the niobium by the Teflon adhesive is superior to the wetting of prior art electrode materials. As a result, the elements of the sector assembly are more securely held together. In addition, the niobium electrode provides lower resistivity than prior art electrodes. The lower resistivity electrode compensates for electrical effects of carbon coating 220. The carbon coating functions to some degree as a dissipator of localized charges on the platen surface, because the carbon coating is somewhat more conductive than the alumina surface. As a result, the clamping force is somewhat reduced by the carbon coating. By providing niobium electrodes with lower resistivities, more charge is supplied to the clamping surface. Thus, although some charge is dissipated, the clamping force is restored to its desired value. Niobium is believed to provide the benefit of more evenly distributing charges within each sector. This results in a more even clamping force over the wafer area and reduces the amount of localized point force concentrations which may cause wafer damage and particle generation. In a preferred embodiment, the niobium electrodes are sputtered from a niobium source of 99% purity to a thickness D4 which achieves 0.13 ohms per square. Nitrogen may be added near the end of the process to form niobium nitride on the surface of the electrode and thereby provide low surface resistivity. It will be understood that different resistivities will be required for different geometries.

When the electrostatic wafer clamp is energized, the wafer vibrates due to the forces resulting from the alternating electric fields. The magnitude of the vibration is believed to be sufficient to contribute to some extent to particle generation. The magnitudes of vibration have been measured to be less than 0.001 inch on prior art electrostatic wafer clamps and thus do not affect the implant process directly. However, it is believed that a reduction in vibration will produce an improvement in particle performance. The sector assemblies in prior art wafer clamps are held to the platen base by a relatively rigid epoxy. The sector assemblies thus define a relatively stationary surface against which the wafer impacts during vibration. According to a further feature of the invention, the rigid epoxy is replaced with a resilient, lower durometer adhesive 230 (FIG. 4). This permits the sector assemblies to move by a very small amount relative to platen base 14. When the electrostatic field is activated, the wafer is drawn to the sector assembly, and the sector assembly is also drawn slightly toward the wafer, thus reducing the distance traveled by the wafer. Consequently, the wafer impacts at a lower velocity and at a significantly reduced force. Additionally, the impact energy is somewhat absorbed by the damping qualities of the low durometer adhesive. An example of a suitable low durometer adhesive is 50 durometer silicone adhesive.

In prior art wafer clamps, the platen base 14 is provided with sector shaped recesses to locate the sector assemblies during manufacturing. An outer lip 240 of each recess, shown in phantom in FIG. 4, retains the sector assembly radially. However, when a sector assembly is secured in the recess with an adhesive, a small space 242 is left between the lip 240 and the sector assembly. This space 242 acts as a particle reservoir. The electrostatic field of the wafer clamp attracts free particles and deposits them at and near the edge of the sector assembly, where they tend to fall into space 242 and accumulate. Particles also accumulate on lip 240.

According to a further feature of the invention, the lip of the platen base is removed or lowered so that it is spaced from the wafer by a greater distance than in prior art wafer clamps. Particles then have a lower probability of being deposited in the region of the lip and in the space between the lip and the sector assembly. Any particles that are deposited in this region are spaced farther from the wafer than in prior art wafer clamps. In addition, the periphery of the platen is easier to clean. The sector assemblies may be located relative to the platen base during assembly using a jig, as is known in the manufacturing art.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for electrostatic clamping of a workpiece, comprising:
   a platen assembly defining an electrically insulating clamping surface for receiving a workpiece, said platen assembly comprising electrodes underlying and electrically isolated from said clamping surface and a dielectric layer between said electrodes and said clamping surface, said dielectric layer having a periphery which is beveled to define a blunt first edge that forms a boundary of the clamping surface and a second edge that is spaced from the workpiece, wherein the beveled periphery of said dielectric layer defines a beveled surface that is located outwardly of said electrodes and wherein said blunt first edge is blended and polished to form a smooth transition, without sharp edges, between said beveled surface and said clamping surface; and
   a clamping control circuit for applying clamping voltages to said electrodes for electrostatically clamping the workpiece in a fixed position on said clamping surface.

2. Apparatus as defined in claim 1, wherein said second edge is spaced from the workpiece on said clamping surface by at least about 0.004 inch.

3. Apparatus as defined in claim 1, wherein said dielectric layer comprises a material selected from the group consisting of alumina, silicon carbide and aluminum nitride.

4. Apparatus as defined in claim 1, wherein said dielectric layer comprises alumina.

5. Apparatus as defined in claim 4, wherein said platen assembly further comprises a low friction, high hardness dielectric coating overlying said alumina and defining said clamping surface.

6. Apparatus as defined in claim 4, wherein said platen assembly further comprises a diamond-like amorphous carbon coating overlying said alumina and defining said clamping surface.

7. Apparatus as defined in claim 6, wherein said carbon coating has a thickness in a range of about 0.5 micrometer to about 5.0 micrometers.

8. Apparatus as defined in claim 6, wherein said dielectric layer includes a side adjacent to said clamping surface and wherein said carbon coating covers the side of said dielectric layer.

9. Apparatus as defined in claim 6, wherein said electrodes comprise niobium.

10. Apparatus for electrostatic clamping of a workpiece, comprising:
    a platen assembly defining an electrically insulating clamping surface for receiving a workpiece, said platen assembly comprising electrodes underlying and electrically isolated from said clamping surface and a dielectric layer between said electrodes and said clamping surface, said dielectric layer having a periphery which is beveled to define a blunt first edge that forms a boundary of the clamping surface and a second edge that is spaced from the workpiece, wherein the beveled periphery of said dielectric layer defines a beveled surface that forms an angle of less than about 10 degrees with respect to the workpiece positioned on said clamping surface; and
    a clamping control circuit for applying clamping voltages to said electrodes for electrostatically clamping the workpiece in a fixed position on said clamping surface.

11. Apparatus for electrostatic clamping of a workpiece, comprising:
    a platen assembly defining an electrically insulating clamping surface for receiving a workpiece, said platen assembly comprising electrodes underlying and electrically isolated from said clamping surface, a relatively thick dielectric layer between each of said electrodes and said clamping surface and a relatively thin, low friction, high hardness dielectric coating overlying said dielectric layer and forming said clamping surface, wherein said dielectric coating comprises amorphous carbon, and wherein said dielectric coating has a thickness in a range of about 0.5 micrometer to about 5.0 micrometers; and
    a clamping control circuit for applying clamping voltages to said electrodes for electrostatically clamping the workpiece in a fixed position on said clamping surface.

12. Apparatus as defined in claim 11, wherein said dielectric layer comprises a material selected from the group consisting of alumina, silicon carbide and aluminum nitride.

13. Apparatus as defined in claim 11, wherein said dielectric layer comprises alumina.

14. Apparatus as defined in claim 11 wherein said dielectric layer has a thickness of several thousandths of an inch.

15. Apparatus as defined in claim 11, wherein said dielectric layer includes a side adjacent to said clamping surface and wherein said dielectric coating covers said side.

16. Apparatus as defined in claim 11, wherein said electrodes comprise niobium.

17. Apparatus as defined in claim 11 wherein said dielectric layer comprises alumina having a thickness of several thousandths of an inch, and said electrodes comprise niobium.

18. Apparatus as defined in claim 11, wherein said dielectric layer has a periphery which is beveled to define a blunt first edge that forms a boundary of the clamping surface and a second edge that is spaced from the workpiece.

19. Apparatus as defined in claim 18, wherein said beveled periphery defines a beveled surface that forms an angle of less than about 10 degrees with respect to the workpiece positioned on said clamping surface.

20. Apparatus as defined in claim 19, wherein said beveled surface is located outwardly of said electrodes.

21. Apparatus for electrostatic clamping of a semiconductor wafer, comprising:
    a platen comprising a plurality of sector assemblies mounted on a platen base, said sector assemblies defining a substantially circular, electrically insulating clamping surface for receiving a semiconductor wafer, each of said sector assemblies comprising a conductive electrode underlying and electrically isolated from said clamping surface, an upper dielectric layer between said electrode and said clamping surface, and a lower dielectric layer between said electrode and said platen base, said upper dielectric layer having a periphery which is beveled to define a blunt first edge that forms a boundary of the clamping surface and a second edge that is spaced from the semiconductor wafer, wherein the beveled periphery of said dielectric layer defines a beveled surface that is located outwardly of said electrodes and wherein said blunt first edge is blended and polished to form a smooth transition, without sharp edges, between said beveled surface and said clamping surface; and a clamping control circuit for applying clamping voltages to said electrodes for electrostatically clamping the semiconductor wafer in a fixed position on said clamping surface.

22. Apparatus for electrostatic clamping as defined in claim 21, wherein the beveled periphery of said upper dielectric layer defines a beveled surface that forms an angle of less than about 10 degrees with respect to the semiconductor wafer positioned on said clamping surface.

23. Apparatus for electrostatic clamping as defined in claim 21, wherein said second edge is spaced from the semiconductor wafer on said clamping surface by at least about 0.004 inch.

24. Apparatus for electrostatic clamping as defined in claim 21, wherein said upper dielectric layer comprises alumina.

25. Apparatus for electrostatic clamping as defined in claim 24, wherein each of said sector assemblies further comprises a diamond-like amorphous carbon coating overlying said upper dielectric layer and defining said clamping surface.

26. Apparatus for electrostatic clamping as defined in claim 25, wherein said carbon coating has a thickness in a range of about 0.5 micrometer to about 5.0 micrometers.

27. Apparatus for electrostatic clamping as defined in claim 25, wherein each of said sector assemblies includes a side adjacent to said clamping surface and wherein said carbon coating covers the sides of said sector assemblies.

28. Apparatus for electrostatic clamping as defined in claim 25, wherein said electrodes comprise niobium.

29. Apparatus for electrostatic clamping as defined in claim 25, wherein said carbon coating has a thickness of about 1.5 micrometers.

30. Apparatus for electrostatic clamping as defined in claim 22, wherein said beveled surface forms an angle of about 5 degrees with respect to the semiconductor wafer positioned on said clamping surface.

31. Apparatus for electrostatic clamping as defined in claim 21, wherein each of said sector assemblies is secured to said platen base with a low durometer adhesive.

32. Apparatus for electrostatic clamping as defined in claim 21 wherein said platen base is configured to avoid recesses.

33. Apparatus for electrostatic clamping of a semiconductor wafer, comprising:

a platen comprising a plurality of sector assemblies mounted on a platen base, said sector assemblies defining a substantially circular, electrically insulating clamping surface for receiving a semiconductor wafer, each of said sector assemblies comprising a conductive electrode underlying and electrically isolated from said clamping surface, a relatively thick upper dielectric layer between each of said electrodes and said clamping surface, a relatively thin, low friction, high hardness dielectric coating overlying said upper dielectric layer and forming said clamping surface, and a lower dielectric layer between said electrode and said platen base, wherein said dielectric coating comprises amorphous carbon, and wherein said dielectric coating has a thickness in a range of about 0.5 micrometer to about 5.0 micrometers; and a clamping control circuit for applying clamping voltages to said electrodes for electrostatically clamping the semiconductor wafer in a fixed position on said clamping surface.

* * * * *